US008253235B2

United States Patent
Chen et al.

(10) Patent No.: US 8,253,235 B2
(45) Date of Patent: Aug. 28, 2012

(54) SEMICONDUCTOR PACKAGING SUBSTRATE IMPROVING CAPABILITY OF ELECTROSTATIC DISSIPATION

(75) Inventors: Tsung Lung Chen, Tainan County (TW); Ming Hsun Li, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 233 days.

(21) Appl. No.: 12/768,266

(22) Filed: Apr. 27, 2010

(65) Prior Publication Data

US 2010/0207268 A1  Aug. 19, 2010

Related U.S. Application Data

(62) Division of application No. 11/797,636, filed on May 4, 2007, now Pat. No. 7,732,911.

(30) Foreign Application Priority Data

Jan. 3, 2007 (TW) ............................... 96100249 A (51) Int. Cl.
*H01L 23/48* (2006.01)
*H01L 23/52* (2006.01)

(52) U.S. Cl. ........ 257/692; 257/678; 257/698; 257/725; 257/E21.504; 257/E23.079

(58) Field of Classification Search ............ 257/692, 257/678, 698, 725, E21.504, E23.079
See application file for complete search history.

(56) References Cited

U.S. PATENT DOCUMENTS

2004/0121571 A1   6/2004  Uchikoshi et al.
2007/0228574 A1*  10/2007  Uchikoshi et al. ............ 257/760

OTHER PUBLICATIONS

Office Action dated May 27, 2010 for 09920361280 which is a corresponding Taiwanese application that cites US 2004/0121571A1.

* cited by examiner

*Primary Examiner* — Cuong Q Nguyen
*Assistant Examiner* — Cathy N Lam
(74) *Attorney, Agent, or Firm* — WPAT, P.C.; Anthony King (57) ABSTRACT

A semiconductor packaging substrate with improved capability of electrostatic dissipation comprises a dielectric layer, a plurality of leads, a plurality of first electrostatic guiding traces, a plurality of second electrostatic guiding traces and a solder mask. The first electrostatic guiding traces and the second electrostatic guiding traces are formed in pairs in a plurality of electrostatic dissipation regions on the dielectric layer, where each pair of the first and second electrostatic guiding traces are disposed in equal line spacing and are electrically isolated from each other. The solder mask partially covers the leads but exposes the first electrostatic guiding traces and the second electrostatic guiding traces. The first electrostatic guiding traces are connected to some of the leads to enhance protection against electrostatic discharge.

13 Claims, 6 Drawing Sheets

SEMICONDUCTOR PACKAGING SUBSTRATE IMPROVING CAPABILITY OF ELECTROSTATIC DISSIPATION

CROSS REFERENCE TO RELATED APPLICATIONS

This application is a Divisional Application Ser. No. 11/797,636 filed May 4, 2007, and is based on and claims priority from R.O.C. Patent Application No. 096100249 filed Jan. 3, 2007.

BACKGROUND OF THE INVENTION

1. Field of the Invention

The present invention relates to a semiconductor packaging substrate, especially, to a semiconductor packaging substrate with enhanced protection against electrostatic discharge.

2. Description of the Related Art

Electrostatic charges are commonly created by the contact and separation of two materials. Virtually all materials, even conductor, can be triboelectrically charged and the voltage of the electrostatic charges, can be very high, even up to thousands of volts. Therefore, if the electrostatic charges are suddenly discharged, the electronic components may be seriously damaged, which is so-called electrostatic discharge (ESD). ESD is likely to occur throughout the semiconductor packaging process leading to unexpected damage to the integrated circuit, IC.

Figure 1:
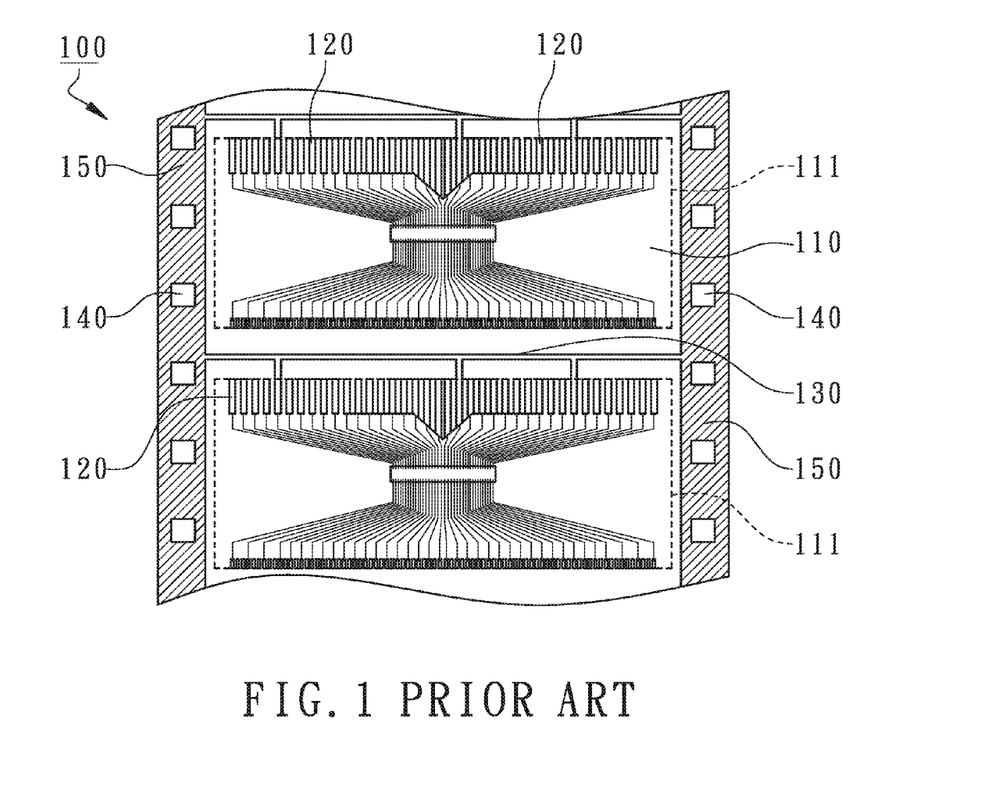
FIG. 1 shows a top view of a conventional semiconductor packaging substrate.

As shown in FIG. 1, a conventional semiconductor packaging substrate 100 primarily comprises a dielectric layer 110, a plurality of leads 120 and a solder mask (not shown in the figure), where a plurality of packaging units 111 are defined on the dielectric layer 110. The leads 120 are formed in the packaging units 111 and are partially covered by the solder mask. A plurality of equal-spacing sprocket holes and the plating buses 150 are disposed on the peripheral areas of the two longitudinal sides of the substrate 100. A plurality of guide lines 130 are formed between the packaging units 111 and are electrically connected to some of the leads 120, such as ground leads, to provide an electrostatic dissipation path, where the two ends of the guide lines 130 are electrically connected to the plating buses 150 at the two longitudinal sides of the substrate 100. However, the guide lines 130 are thin long traces and in connection to the plating buses 150 provides only an electrostatic dissipation path of direct grounding. Ionizers in this case can hardly provide any effect on electrostatic dissipation. Therefore, throughout the packaging process, the accumulated electrostatic charges can be rapidly dissipated only when the plating buses 150 are grounded. If the plating buses 150 are not grounded, the ESD sensitive leads may be damaged by the sudden electrostatic discharge leading to electrical failure of the chip.

In R.O.C. Taiwan Patent No. I228819, entitled "Semiconductor packaging structure", a semiconductor packaging substrate similar to the one mentioned above is revealed. A conductive trace directly connects a ground lead to a guard ring for electrostatic dissipation. However, since electrostatic discharge usually occurs suddenly and the guard ring which is thin and long in shape only provides a small dissipation area, the design is unlikely to render enough protection to the leads from thousands of volts of ESD.

In Taiwan Patent No. I227939, entitled "Encapsulated structure of COF (chip on film)", a semiconductor package is revealed. A structure of embedded capacitor is fabricated in the gap between the chip and the substrate, where the embedded capacitor is composed of two metal plates, one disposed on the chip and the other on the substrate, opposite to and separated from each other. However, this design not only will alter the package structure but increase the manufacturing cost to fabricate the embedded capacitor in between the chip and the substrate. The embedded capacitor may also cause some negative impacts on the reliability of the package structures since the integrity of the package structure has been disturbed by inserting the embedded capacitor in-between the chip and the substrate and its capacitance is not stable due to the shift of the chip. Moreover, since the embedded capacitor is disposed in the gap between the chip and the substrate, the electrostatic charges are prone to accumulate within the tiny space and can hardly be removed; the effectiveness of electrostatic dissipation is hence reduced.

SUMMARY OF THE INVENTION

The main purpose of the present invention is to provide a semiconductor packaging substrate with enhanced protection against electrostatic discharge. Potential differences are generated to facilitate dissipation of the electrostatic charges and the electrostatic dissipation area is increased so that the capability of electrostatic dissipation during the semiconductor packaging process can be enhanced without changing the package structure.

According to the present invention, a semiconductor packaging substrate with enhanced protection against electrostatic discharge primarily comprises a dielectric layer, a plurality of leads, a plurality of first electrostatic guiding traces, a plurality of second electrostatic guiding traces and a solder mask. A plurality of packaging units and a plurality of electrostatic dissipation regions are defined on a surface of the dielectric layer. The leads are formed in the packaging units on the dielectric layer. The first electrostatic guiding traces and the second electrostatic guiding traces are formed in the electrostatic dissipation regions on the dielectric layer. Each electrostatic dissipation region includes at least one first electrostatic guiding trace and at least one second electrostatic guiding trace where the first electrostatic guiding trace and the corresponding second electrostatic guiding trace are separated in equal line spacing and are electrically isolated from each other and the first electrostatic guiding trace is electrically connected to some of the leads. The solder mask is formed on the dielectric layer to partially cover the leads but completely expose the first electrostatic guiding traces and the second electrostatic guiding traces.

BRIEF DESCRIPTION OF THE DRAWINGS

The objectives and advantages of the present invention will become apparent upon reference to the following description and the accompanying drawings in which.

DETAILED DESCRIPTION OF THE INVENTION

Please refer to the attached drawings, the present invention will be described by means of embodiment(s) below.

Figure 2:
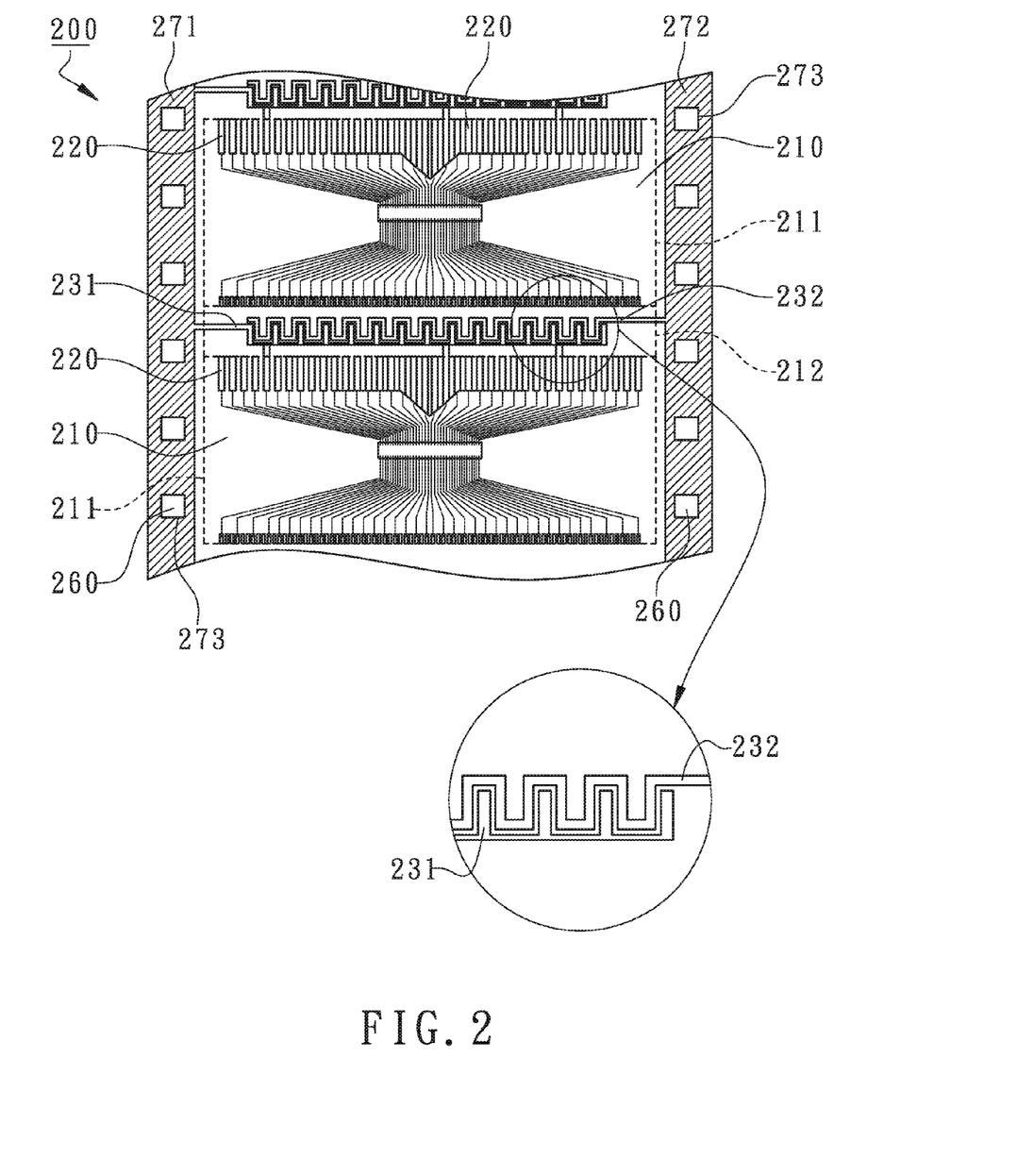
FIG. 2 shows a top view of a semiconductor packaging substrate with enhanced protection against electrostatic discharge according to the first embodiment of the present invention.
Figure 3:
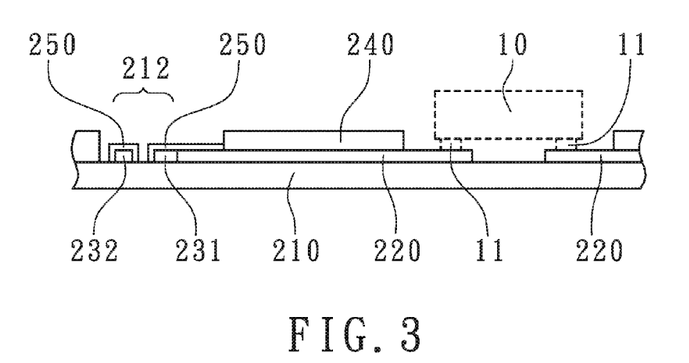
FIG. 3 shows partially a cross-sectional view of the semiconductor packaging substrate according to the first embodiment of the present invention.

According to the first embodiment of the present invention, as shown in FIG. 2 and FIG. 3, a semiconductor packaging substrate 200 primarily includes a dielectric layer 210, a plurality of leads 220, a plurality of first electrostatic guiding traces 231, a plurality of second electrostatic guiding traces 232 and a solder mask 240. A plurality of packaging units 211 and a plurality of electrostatic dissipation regions 212 are defined on a surface of the dielectric layer 210. After the complete packaging process, a plurality of individual semiconductor packages are singulated along the peripheries of the packaging units 211 which are also called effective area. The electrostatic dissipation regions 212 are located between each two adjacent packaging units 211 or beside at least one side of each individual packaging unit 211. The electrostatic charges accumulated at the ground leads or ESD sensitive leads can first be dispersed to the electrostatic dissipation regions 212 exposed from the solder mask 240 and then neutralized by an ionizer.

The leads 220 are formed in the packaging units 211 on the dielectric layer 210; moreover, the first electrostatic guiding traces 231 and the second electrostatic guiding traces 232 are formed in the electrostatic dissipation regions 212 on the dielectric layer 210. Each electrostatic dissipation region 212 includes at least a first electrostatic guiding trace 231 and a second electrostatic guiding trace 232 in pairs. The first electrostatic guiding trace 231 and the second electrostatic guiding trace 232 in each electrostatic dissipation region 212 are formed in equal line spacing and are electrically isolated from each other, and the first electrostatic guiding trace 231 is electrically connected to some of the leads 220, especially the ESD sensitive leads or ground leads, to dissipate the accumulated electrostatic charges to the electrostatic dissipation region 212 which is completely exposed from the solder mask 240. The second electrostatic guiding trace 232 can connect or not connect to some of the leads 220 of the adjacent packaging unit, not shown in the figure. Preferably, the second ESD traces 232 are grounded.

The solder mask 240 is formed on the dielectric layer 210 to partially cover the leads 220 but completely expose the first electrostatic guiding traces 231 and the second electrostatic guiding traces 232.

Preferably, the first electrostatic guiding traces 231 and the corresponding second electrostatic guiding traces 232 are separated in equal line spacing and disposed in a wave shape including round waves and square waves where the square waves are preferred. The first electrostatic guiding traces 231 and the corresponding second electrostatic guiding traces 232 are exposed from the solder mask 240 and with potential differences so that electrostatic charges on the leads 220 or the device can either be dispersed by the potential difference between the first electrostatic guiding traces 231 and the corresponding second electrostatic guiding traces 232 or neutralized with an ionizer during the semiconductor packaging process. Therefore, the capability of electrostatic dissipation for an overall packaging process of the semiconductor devices can be enhanced. To be more specific, the best spacing between a first electrostatic guiding trace 231 and the corresponding second electrostatic guiding trace 232 is not greater than 15 µm to keep a better and effective potential difference. Furthermore, as shown in FIG. 3, a plated tin 250 is formed on the exposed surfaces of the first electrostatic guiding traces 231 and the second electrostatic guiding traces 232 to avoid oxidization.

The solder mask 240 can be a liquid photoimagable solder mask (LPI), a photoimagable cover layer (PIC), or a non-photosensitive non-conductive solder mask or cover layer. The inner ends of the leads 220 are exposed from the solder mask 240 for bonding to the bumps 11 of the chip 10, as shown in FIG. 3. Furthermore, the solder mask 240 also exposes the outer ends of the leads 220 as well as the first electrostatic guiding traces 231 and the second electrostatic guiding traces 232.

In the present embodiment, the substrate 200 is a thin circuit film which is mostly used in Chip-On-Film (COF) package, or in Tape Carrier Package (TCP). As shown in FIG. 2, a plurality of sprocket holes 260 are formed on the peripheral areas of the two longitudinal sides of the dielectric layer 210 for reel-to-reel transportation of the substrate 200. Normally, an exposed first plating bus 271 and an exposed second plating bus 272 extend along the two longitudinal sides of the dielectric layer 210 to provide grounding paths and to increase the electrostatic dissipation area. Preferably, the first electrostatic guiding traces 231 are connected to the first plating bus 271 to create a potential difference between the first electrostatic guiding traces 231 and the corresponding second electrostatic guiding traces 232. Moreover, the second electrostatic guiding traces 232 can connect or not connect to the second plating bus 272.

In the present embodiment, a potential difference between the first electrostatic guiding trace 231 and the corresponding second electrostatic guiding trace 232 can also be generated to achieve the same electrostatic dissipation effects without connecting the first electrostatic guiding traces 231 to the first plating bus 271.

The first plating bus 271 and the second plating bus 272 have a plurality of perforations 273 disposed on the peripheral areas of the two longitudinal sides of the dielectric layer 210 and aligned to the sprocket holes 260 where the dimension of the perforations 273 may be slightly larger than that of the sprocket holes 260.

During the semiconductor packaging process, the substrate 200 is transported reel-to-reel. Ionizers are installed on almost all the packaging equipment charging the molecules of the surrounding air of the exposed electrostatic dissipation regions 312 during the transportation of the substrates 200 to neutralize the electrostatic charges accumulated in the first electrostatic guiding traces 231 and the second electrostatic guiding traces 232 so that it can avoid damage of the sudden discharging of electrostatic charges to the semiconductor devices. Therefore, the substrate 200 in the present embodiment of the present invention is specially designed for thin circuits film which is mostly used in COF or TCP packages to enhance the capability of electrostatic dissipation. Furthermore, the shapes of the first electrostatic guiding traces 231 and the second electrostatic guiding traces 232 are not limited in the present invention.

Figure 4:
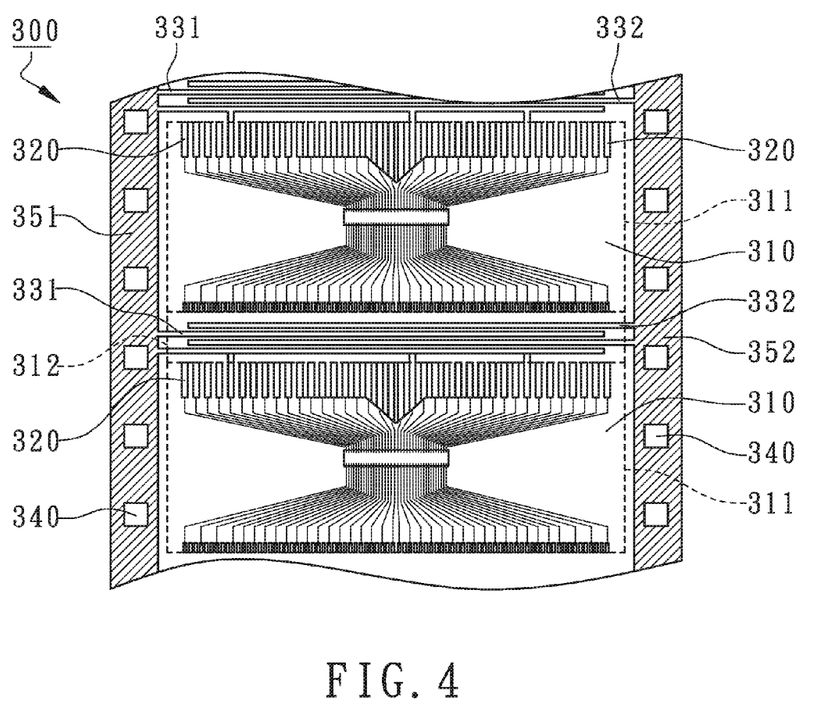
FIG. 4 shows a top view of a semiconductor packaging substrate according to the second embodiment of the present invention.

Another semiconductor packaging substrate 300 is revealed in FIG. 4, which comprises a dielectric layer 310, a plurality of leads 320, a plurality of first electrostatic guiding traces 331, a plurality of second electrostatic guiding traces 332 and a solder mask, not shown in the figure. A plurality of packaging units 311 and a plurality of electrostatic dissipation regions 312 are defined on a surface of the dielectric layer 310.

The leads 320 are formed in the packaging units 311 on the dielectric layer 310, and the first electrostatic guiding traces 331 and the second electrostatic guiding traces 332 are formed in the electrostatic dissipation regions 312 on the dielectric layer 310. Each electrostatic dissipation region 312 includes at least a first electrostatic guiding trace 331 and at least a second electrostatic guiding trace 332. The first electrostatic guiding trace 331 and the corresponding second electrostatic guiding trace 332 are disposed in equal line spacing and are electrically isolated from each other, and the first electrostatic guiding trace 331 is electrically connected to some of the leads 320, such as ESD sensitive leads or ground leads, to disperse the electrostatic charges to the electrostatic dissipation region 312 which is completely exposed from the solder mask 340. In the present embodiment, the first electrostatic guiding traces 331 and the corresponding second electrostatic guiding traces 332 are disposed in comb or parallel fence shapes to dissipate the electrostatic charges by potential differences in the electrostatic dissipation regions 312 and to neutralize the electrostatic charges by an ionizer to increase electrostatic protection during the semiconductor packaging process. The solder mask is formed on the dielectric layer 310 to partially cover the leads 320 but expose the first electrostatic guiding traces 331 and the second electrostatic guiding traces 332. In the present embodiment, a plurality of sprocket holes 340, a first plating bus 351 and a second plating bus 352 extend along the two longitudinal sides of the dielectric layer 310 where the first electrostatic guiding traces 331 can connect or not connect to the first plating bus 351 so as the second electrostatic guiding traces 332 can connect or not connect to the second plating bus 352.

Figure 5:
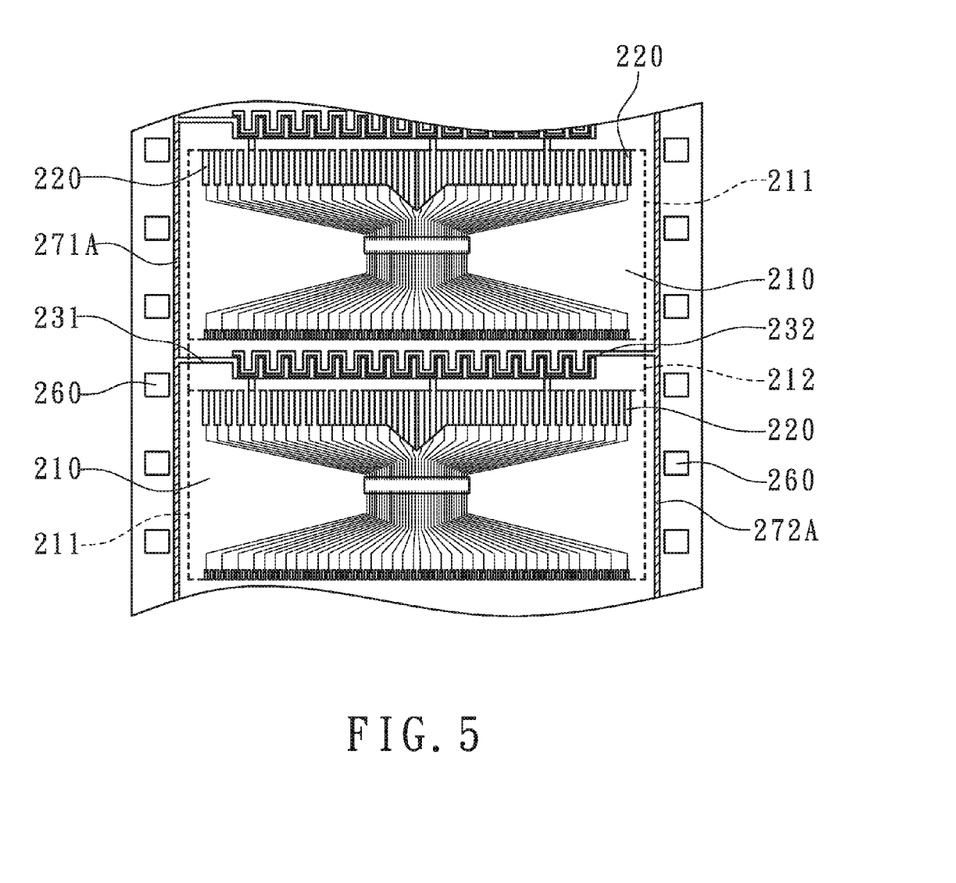
FIG. 5 shows a top view of a semiconductor packaging substrate according to the third embodiment of the present invention.

Another semiconductor packaging substrate is revealed in the third embodiment of the present invention as shown in FIG. 5. The major components of the substrate are the same as the first embodiment such as the dielectric layer 210, the leads 220, the first electrostatic guiding traces 231, the second electrostatic guiding traces 232 and the solder mask 240. The substrate further comprises a first plating bus 271A and a second plating bus 272A where the first plating bus 271A and the second plating bus 272A are located on the areas between the sprocket holes 260 and the packaging units 211 and extend along the two longitudinal sides of the substrate. Furthermore, the first electrostatic guiding traces 231 can be connected to the first plating bus 271A and the second electrostatic guiding traces 232 to the second plating bus 272A to provide a potential difference between the first electrostatic guiding traces 231 and the second electrostatic guiding traces 232.

Figure 6:
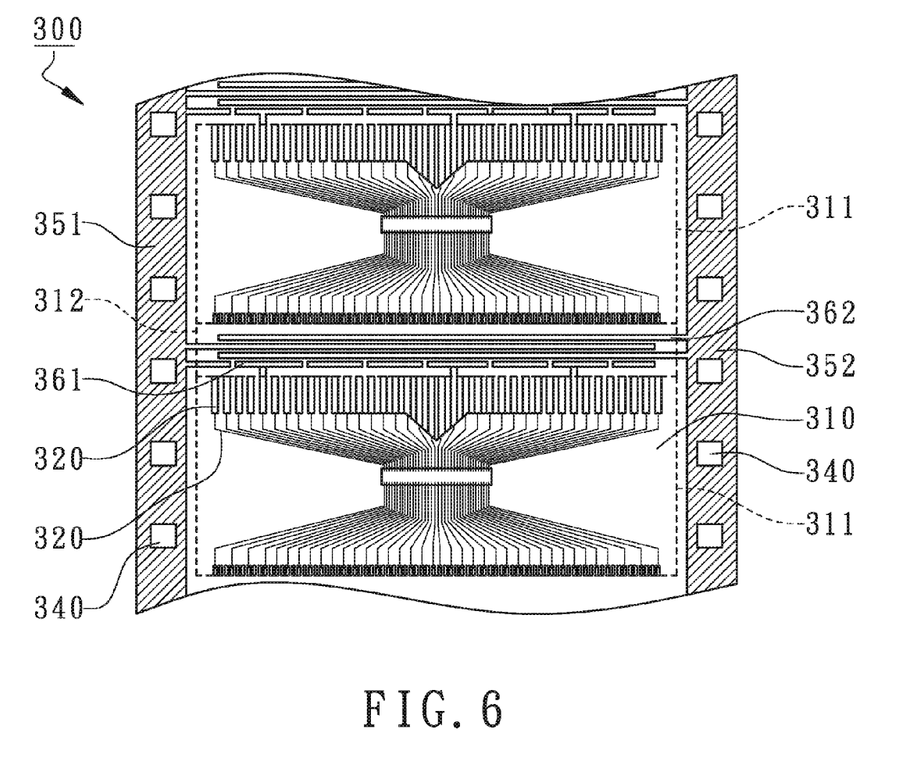
FIG. 6 shows a top view of a semiconductor packaging substrate according to the fourth embodiment of the present invention.

Another semiconductor packaging substrate is revealed in the fourth embodiment of the present invention as shown in FIG. 6. The major components of the substrate are the same as the second embodiment such as the dielectric layer 310, the leads 320, the sprocket holes 340 and the first and the second plating bus 351 and 352. The substrate further comprises a plurality of first electrostatic guiding traces 361 and a plurality of second electrostatic guiding traces 362 formed in the electrostatic dissipation regions 312 on the dielectric layer 310 where the electrostatic dissipation regions 312 are completely exposed from the solder mask and located between each two adjacent packaging units 311. Each electrostatic dissipation region 312 includes at least a first electrostatic guiding trace 361 and at least a second electrostatic guiding trace 362 where the first electrostatic guiding trace 361 and the adjacent second electrostatic guiding trace 362 are formed in equal spacing and are electrically isolated from each other. The at least one first electrostatic guiding trace 361 is divided into discontinuous lines and connected to some of the leads 320 in a packaging unit 311. The second electrostatic guiding traces 362 are connected to at least a plating bus 351 and/or 352. Therefore, protection against ESD for the non-grounding signal leads can be enhanced.

Figure 7:
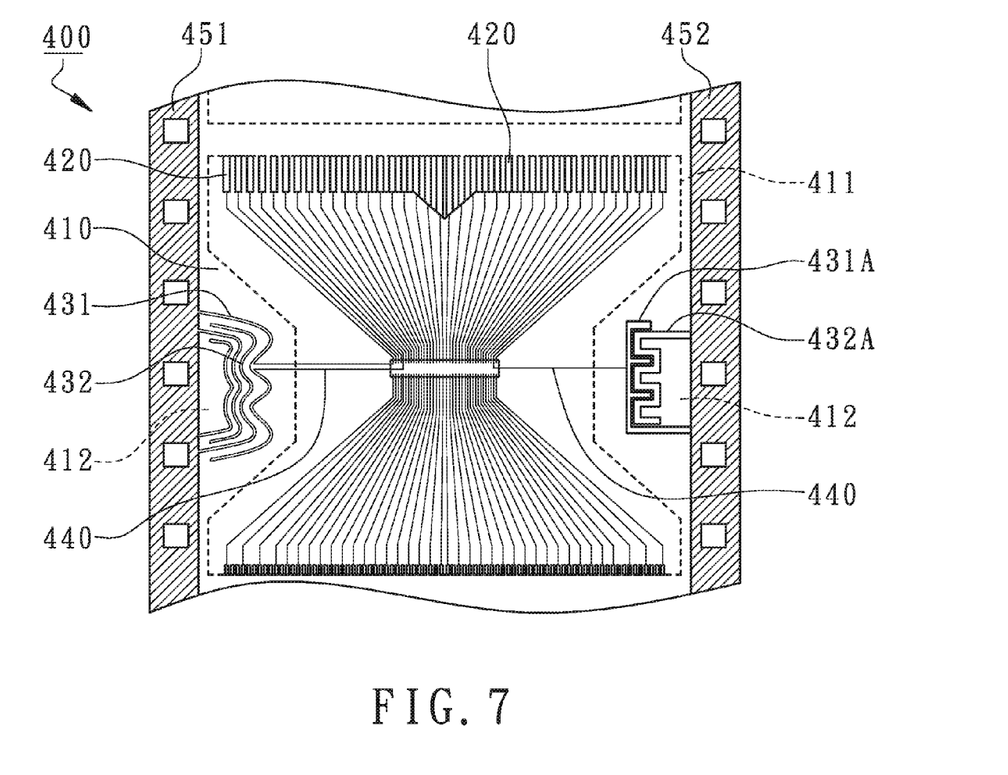
FIG. 7 shows a top view of a semiconductor packaging substrate according to the fifth embodiment of the present invention.

As shown in FIG. 7, another semiconductor packaging substrate 400 is revealed according to the fifth embodiment of the present invention, comprising a dielectric layer 410, a plurality of leads 420, a plurality of first electrostatic guiding traces 431, a plurality of second electrostatic guiding traces 432 and a solder mask, not shown in the figure. A plurality of packaging units 411 and a plurality of electrostatic dissipation regions 412 are defined on a surface of the dielectric layer 410. In the present embodiment, the electrostatic dissipation regions 412 are disposed beside at least one side of each individual packaging unit 411.

Each electrostatic dissipation region 412 includes at least a first electrostatic guiding trace 431 and at least a second electrostatic guiding trace 432 where the first electrostatic guiding trace 431 and the second electrostatic guiding trace 432 are formed in equal line spacing and electrically isolated from each other, and the first electrostatic guiding trace 431 is electrically connected to some of the leads 420, especially the ESD sensitive leads or ground leads, to dissipate the electrostatic charges to the electrostatic dissipation region 412 which is exposed from the solder mask. Normally, the solder mask covers most of the area of each individual packaging unit 411 and exposes the electrostatic dissipation regions 412 to define the boundary of the electrostatic dissipation regions 412. Therefore, the solder mask formed on the dielectric layer 410 can partially cover the leads 420 but expose the first electrostatic guiding traces 431 and the second electrostatic guiding traces 432 for dissipation of the accumulated electrostatic charges. In the present embodiment, the semiconductor packaging substrate 400 is a reel-to-reel thin circuit film, further comprising a first plating bus 451 and the second plating bus 452 where the first plating bus 451 and the second plating bus 452 are disposed along the two longitudinal sides of the dielectric layer 410 and have a plurality of perforations corresponding to the sprocket holes. The dimension of the perforations can be slightly larger than that of the sprocket holes.

In one embodiment, the first electrostatic guiding traces 431 and the second electrostatic guiding traces 432 are in the shapes of continuous waves and the first electrostatic guiding traces 431 are connected to at least one of the leads 420 by a connecting wire 440. One end of the first electrostatic guiding traces 431 can be connected to the first plating bus 451 and one end of the second electrostatic guiding traces 432 can be connected or not connected to the first plating bus 451. In another embodiment, the first electrostatic guiding traces 431A and the second electrostatic guiding traces 432A can be arranged in various shapes such as comb or square waves. The first electrostatic guiding traces 431A are connected to at least one of the leads 420 by a connecting wire 440. One end of the first electrostatic guiding traces 431A and the second electrostatic guiding traces 432A can be connected to the second plating bus 452 for better dissipation of electrostatic charges.

The above-described embodiments of the present invention are intended to be illustrative only. Numerous alternative embodiments may be devised by those skilled in the art without departing from the scope of the following claims.

What is claimed is:

1. A semiconductor packaging substrate comprising:
a dielectric layer having two longitudinal sides and including a plurality of packaging units and a plurality of electrostatic dissipation regions defined on a surface of the dielectric layer;
a plurality of leads formed on the surface of the dielectric layer in each packaging unit;
a plurality of first electrostatic guiding traces and a plurality of second electrostatic guiding traces both formed in the electrostatic dissipation regions and attached to the surface of the dielectric layer, wherein at least a first electrostatic guiding trace and at least a second electrostatic guiding trace disposed in each electrostatic dissipation region are separated in equal line spacing and electrically isolated, and the first electrostatic guiding trace is electrically connected to at least one of the leads; and
a solder mask formed on the dielectric layer to partially cover the leads but expose the first electrostatic guiding traces and the second electrostatic guiding traces;
wherein each electrostatic dissipation region is disposed beside one of the packaging units and adjacent to only one of the two longitudinal sides of the dielectric layer.

2. The semiconductor packaging substrate of claim 1, wherein the electrostatic dissipation regions are completely exposed from the solder mask.

3. The semiconductor packaging substrate of claim 1, wherein the first electrostatic guiding traces and the adjacent second electrostatic guiding traces are parallel and disposed in the shape of a wave.

4. The semiconductor packaging substrate of claim 1, wherein the line spacing between the first electrostatic guiding trace and the adjacent second electrostatic guiding trace is not greater than 15 μm.

5. The semiconductor packaging substrate of claim 1, further comprising a plated tin layer disposed on the first electrostatic guiding traces and the second electrostatic guiding traces.

6. The semiconductor packaging substrate of claim 1, wherein the substrate is a thin circuit film.

7. The semiconductor packaging substrate of claim 6, wherein a plurality of sprocket holes are formed on peripheral areas of the two longitudinal sides of the dielectric layer.

8. The semiconductor packaging substrate of claim 1, further comprising a first plating bus and a second plating bus respectively disposed along the two longitudinal sides of the dielectric layer.

9. The semiconductor packaging substrate of claim 8, wherein the first plating bus and the second plating bus have a plurality of perforations penetrating through the dielectric layer.

10. The semiconductor packaging substrate of claim 8, wherein a plurality of sprocket holes are formed on peripheral areas of the two longitudinal sides of the dielectric layer, and the first plating bus and the second plating bus are disposed between the sprocket holes and the packaging units.

11. The semiconductor packaging substrate of claim 8, wherein the first electrostatic guiding traces are electrically connected to the first plating bus or the second plating bus.

12. The semiconductor packaging substrate of claim 8, wherein the second electrostatic guiding traces are electrically connected to the first plating bus or the second plating bus.

13. The semiconductor packaging substrate of claim 1, wherein the second electrostatic guiding traces are grounded.

* * * * *